United States Patent [19]

Marinello

[11] Patent Number: 5,037,310

[45] Date of Patent: Aug. 6, 1991

[54] CONNECTOR APPARATUS AND METHOD FOR DISTRIBUTED CONTROL MODULES USED IN COMPUTER NETWORKS

[75] Inventor: Marc Marinello, Athenza, Switzerland

[73] Assignee: Gespac, Inc., Mesa, Ariz.

[21] Appl. No.: 446,853

[22] Filed: Dec. 6, 1989

[51] Int. Cl.$^5$ .......................... H01R 9/09; H05K 7/02
[52] U.S. Cl. ....................... 439/61; 439/64; 439/716
[58] Field of Search ............ 439/61, 62, 64, 76, 439/119, 121, 716

[56] References Cited

U.S. PATENT DOCUMENTS

| | | | |
|---|---|---|---|
| 4,618,194 | 10/1986 | Swilos | 439/64 |
| 4,653,823 | 3/1987 | Burson et al. | 439/64 |
| 4,804,335 | 2/1989 | Pennington | 439/64 |
| 4,808,114 | 2/1989 | Mohri et al. | 439/716 |
| 4,838,798 | 6/1989 | Evans et al. | 439/61 |
| 4,878,860 | 11/1989 | Matsuoka | 439/716 |
| 4,956,747 | 9/1990 | Beer et al. | 439/716 |

OTHER PUBLICATIONS

Product Brochure for Transistion Technology Inc., 111 Main Street, Amesbury, Mass. 01913, 1988.

Primary Examiner—Paula A. Bradley
Attorney, Agent, or Firm—Harry M. Weiss

[57] ABSTRACT

This invention discloses an electronic computer network connector system for interfacing control signals at a remote workstation. The connector system includes a cartridge member for modularly housing a distributed control electronic card assembly. The cartridge member and the electronic card assembly form a module. The electronic circuitry of the module provides intelligence for operation of the workstation. Also included in the connector system is a bus rail backplane assembly for electronically interfacing with a host computer system, multiple workstations, with other modules associated with their respective workstation, all in a local area computer network system. The backplane assembly includes a printed wiring board having a cartridge receptacle for detachably retaining the module's cartridge member, service connectors for coupling common signals from the host computer to the module, coupling signals to an associated workstation, to other modules and to other workstations. The service connectors enable the non-interrupted flow of data to a module on the same back plane while servicing serially connected workstations.

13 Claims, 3 Drawing Sheets

CONNECTOR APPARATUS AND METHOD FOR DISTRIBUTED CONTROL MODULES USED IN COMPUTER NETWORKS

FIELD OF THE INVENTION

The present invention relates to connectors for electronic card assemblies. More particularly, the present invention relates to connectors used in computer network systems having intelligent interfacing circuitry requirements at remote processing workstations.

DESCRIPTION OF THE PRIOR ART

Computer systems architectures have changed to include not only centralized architectures but also decentralized architectures having local area networks. The realization of the local area networking has lead to communication networks that link computers and remote automation units that perform various tasks at graphic workstations, or other remote industrial real-time operations such as a robotic assembly line, process control, energy management and security systems. The decentralized architecture has off-loaded electronic requirements that are related to a particular remote workstation to be physically located at the remote interface to the workstation. These electronic requirements may include digital input and output signal processing, keyboard/display interfacing, analog input and output signal processing, power source signals and industry standard communication links such as RS232. The local interface is complicated by the implementation of the distributed intelligence circuitry implementing the electronic requirements that has been off-loaded. The resulting interface interprets into the problem of managing the installation and maintenance of a large number of wires that carry the plurality of control signals between the host computer system to the remote distributed control circuitry and ultimately to the workstation to perform a particular industrial task. Typically, the interface involves an interconnecting system that includes a multi-lead signal cable from the host computer connected to the backplane of a printed wiring board on a workstation bus rail that interfaces to an electronic card assembly having the distributed control circuitry. The electronic card assembly in turn has a connector that is plug-compatible with the connector on the backplane of the printed wiring board on the bus rail. While the connector systems typically used accomplish the desired interfacing tasks, they lack flexibility to enable daisy-chain type serial interconnections from workstation to workstation, lack flexibility for uninterrupted local card operation while servicing the bus rail and lack a reliable card-to-backplane retention connection.

Therefore, a need is seen to exists for a connector apparatus and method that is not only compatible with electrical and mechanical specifications for local area computer network installations, but that will also enable daisy-chain type serial interconnections from workstation to workstation, uninterrupted local card operation while servicing the bus rail and reliable card-to-backplane retention.

SUMMARY OF THE INVENTION

It is therefore a primary objective of the present invention to provide a connector apparatus and method that not only mechanically and electrically interfaces the local area computer network system interface requirements but that also provides easy access, daisy-chain type serial interconnections from workstation to workstation, uninterrupted local card operation while servicing the bus rail and reliable card-to-backplane retention.

The present invention teaches a connector system comprising a cartridge for modularly housing a distributed control electronic card assembly (hereinafter cartridge with electronic card is referred to as module) providing intelligence for operation of a workstation member of a local area computer network processing system, a bus rail backplane assembly associated with a module, the assembly includes a printed wiring board, a multi-pin connector for coupling to a mating connector on the module, a cartridge receptacle for detachably retaining the cartridge member of the module, a plurality of service connectors for coupling common control data signals to the multi-pin connectors for use by the module and for daisy-chain serial interfacing to other workstations in the local area computer network and a rail attachment member. The plurality of service connectors are arranged to enable uninterrupted module operation while servicing the common network communication bus. The plurality of service connectors includes power sourcing and peripheral equipment input/output interfacing.

Therefore, to the accomplishments of the foregoing objects, the invention consists of the foregoing features hereinafter fully described and particularly pointed out in the claims, the accompanying drawings and following disclosure describing in detail the invention, such drawings and disclosure illustrating, however, but one of the various ways in which the invention may be practiced.

DESCRIPTION OF THE PREFERRED EMBODIMENT

Figure 1:
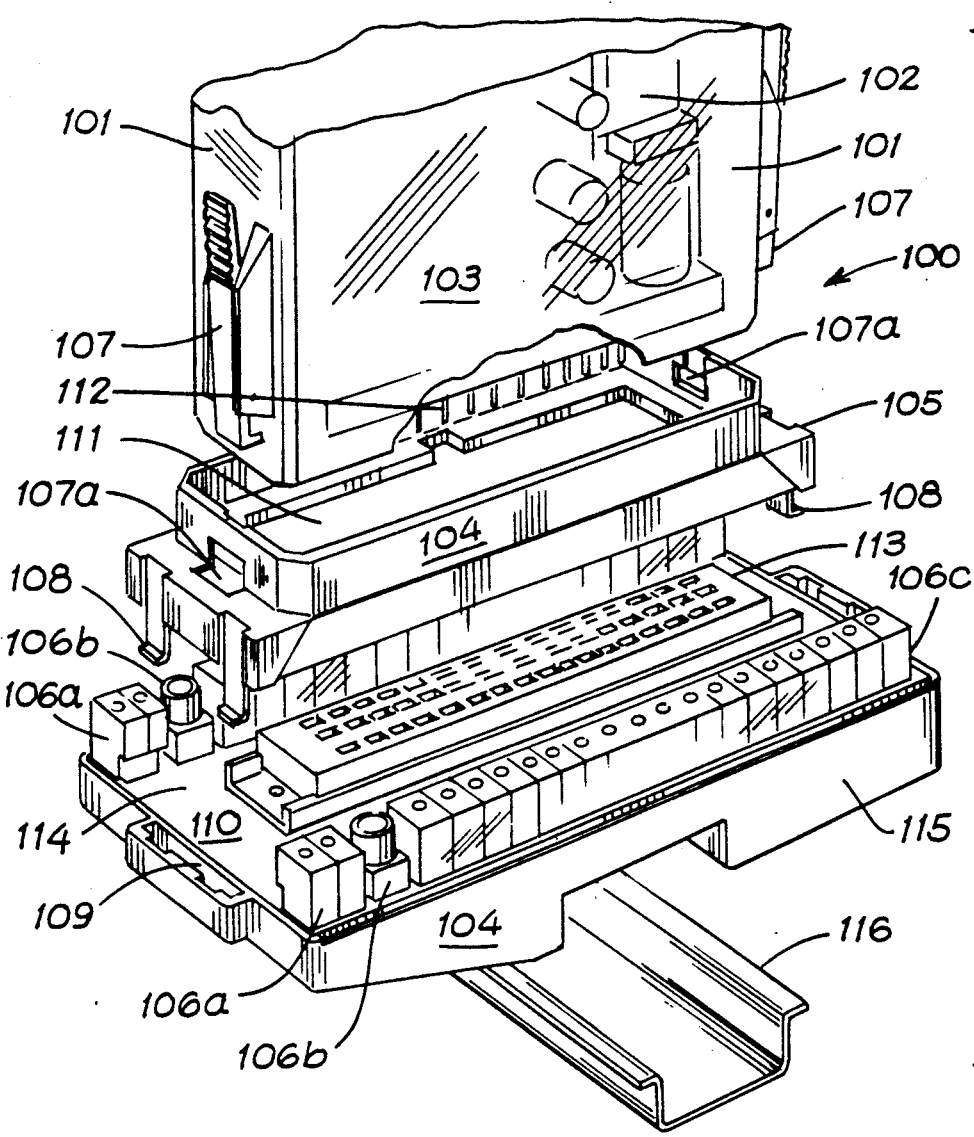
FIG. 1 is a perspective view of the connector system of the present invention illustrating in exploded view the unplugged module positioned above the backplane assembly.
Figure 5:
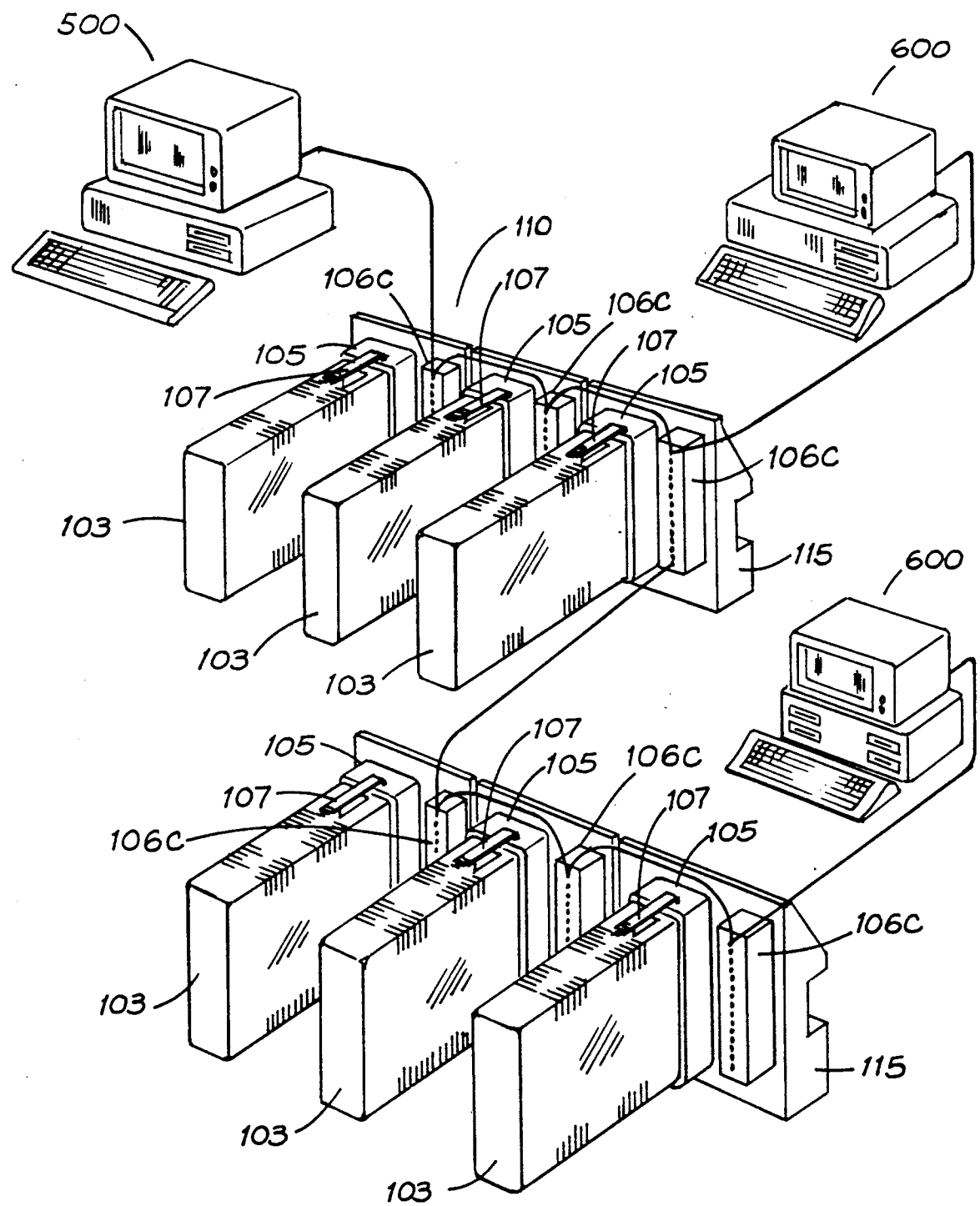
FIG. 5 is a schematic diagram illustrating the present invention in a computer network application including a host computer, bus rail arrangement for configuring a plurality of modules connected serially in the network to other modules and workstations whereby the service connectors in the backplane members may be utilized for servicing without interrupting data flow to the modules.

Referring now to FIG. 1, wherein the connector system 100 of the present invention is seen to comprise a cartridge member means 101 for modularly housing a distributed control electronic card assembly 102, said cartridge means 101 and said electronic card assembly 102 forming a module 103, said module 103 providing intelligence for operation of a workstation 600, see FIG. 5. The module 103 is electrically and mechanically coupled to a bus rail backplane assembly means 104 for electronically interfacing with a host computer system 500 and with a corresponding workstation 600, see FIG. 5. Each backplane assembly means 104 is associated with a corresponding module 103 and has a backplane printed wiring board assembly 110 having a printed wiring board 114 to which is mounted a multi-pin connector 112 for coupling to a mating connector 113. Also mounted to printed wiring board 114 are a plurality of service connectors 106a, 106b and 106c for coupling common control data signals to module 103 and for daisy-chain serial interfacing the common control data signals from host computer 500 to other backplane assemblies 104 and to other workstations 600. The combined arrangement of the printed wiring patterns on printed wiring board 114 and service connectors 106a, 106b, and 106c, having a common signal circuit pattern on the printed wiring board that connects multi-pin connector 112, enables the non-interrupted flow of data from a host computer to a module while allowing servicing of serially connected workstations. A shrouded cartridge receptacle means 105 for detachably retaining cartridge member 101 of module 103 is provided on backplane assembly 104. Cartridge member 101 is provided with a pair of laterally disposed latching means 107 for compressively engaging first mating apertures 107a laterally disposed on cartridge receptacle means 105. Cartridge receptacle means 105 is designed having an aperture means 111 for enabling plugging of multi-pin connector member 112 on electronic card assembly 102 with a mating connector 113 disposed on printed wiring board 114. Cartridge receptacle 105 is provided with a plurality of laterally disposed latching means 108 for compressively engaging second mating apertures 109 laterally disposed on a backplane support member 115 that also supports printed wiring assembly 110. The backplane assembly 104 also includes a rail attachment member 116 for supporting the entire module/backplane assembly apparatus in an equipment enclosure (not shown) of said workstation 600.

Figure 2:
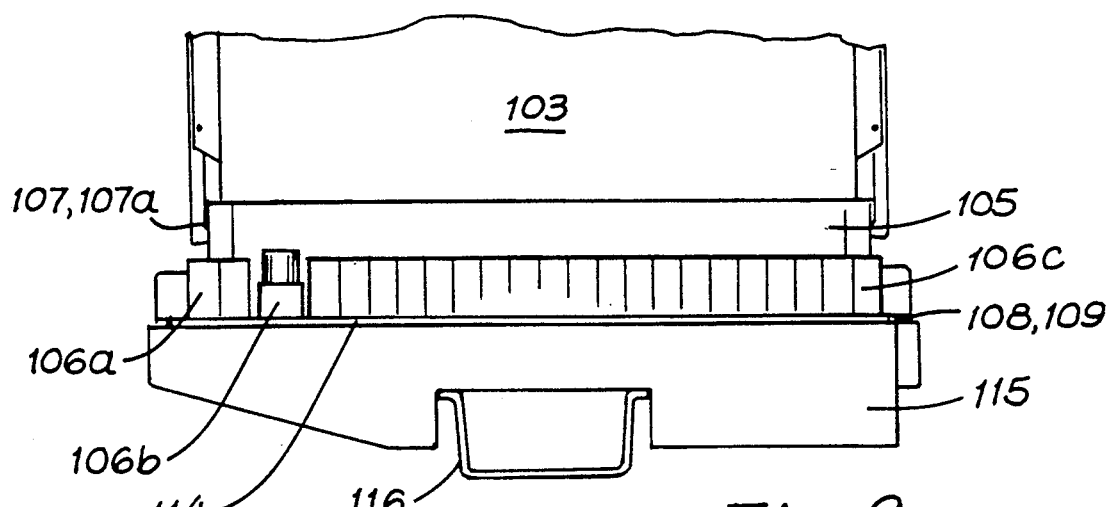
FIG. 2 is a side view of the connector system of the present invention illustrating the assembled connector system wherein the backplane support member is attached to a rail member and the module is plugged into the receptacle.

FIG. 2 is a side view of the present invention showing the connectors 106a, 106b, 106c mounted to printed wiring board 114, with shrouded cartridge receptacle 105 latched to at mechanical attachment point 108, 109 and module 103 plugged to cartridge receptacle 105 at latch point 107, 107a. Also shown is the backplane support 115 having a channel portion for receiving a U-shaped rail member 116.

Figure 3:
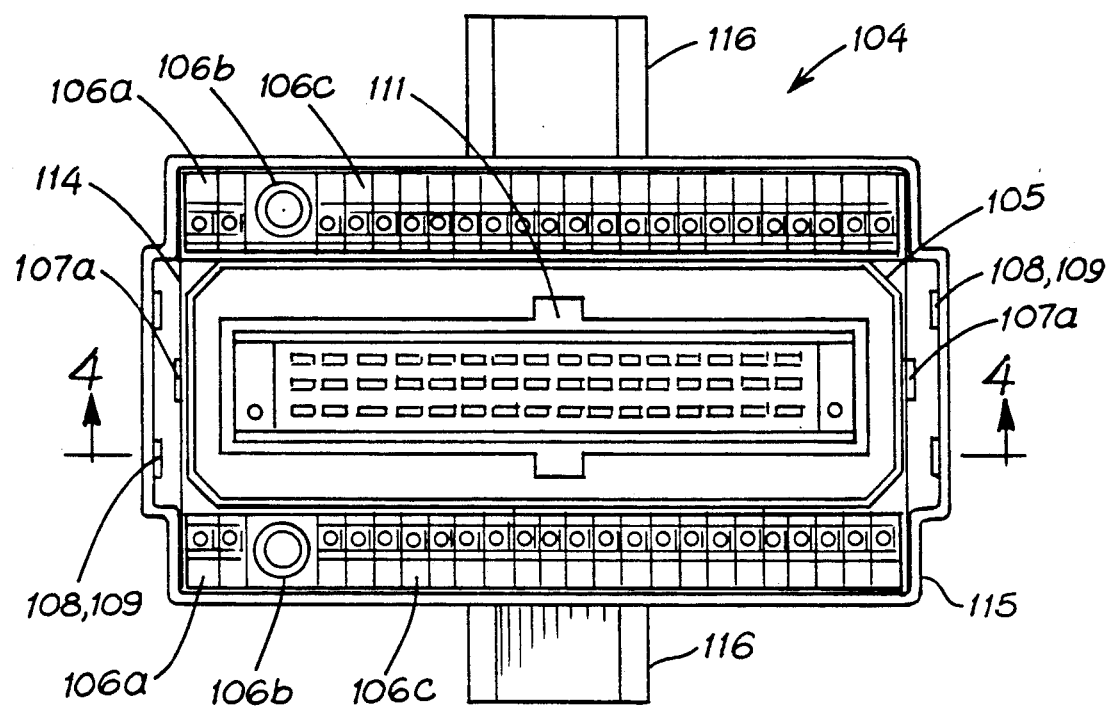
FIG. 3 is a plan view of the backplane assembly showing the populated printed wiring board and rail member of the assembly.

FIG. 3 is a top view of the backplane assembly showing the populated printed wiring board and rail member of the assembly. The cartridge receptacle 105 having aperture 111 has been mounted to backplane support 115 and has multi-pin connector 112 protruding through aperture 111 for subsequent plugging to a mating connector 113. The backplane assembly 104 is shown with a pair of single row in-line service connectors including connectors 106a, 106b and 106c. Table I, shown below, lists a typical set of computer network signals and peripheral input/output functions that are received by a pair of single row set of quick-disconnect service connectors 106a, 106b and 106c. Table II also shows corresponding set of computer network signals as shown in Table I that are interconnected via circuit patterns on printed wiring board 114 (not shown) to effect non-interrupted communication to the module while allowing servicing to serially connected workstation 600.

TABLE I

TYPICAL INPUT/OUTPUT SIGNALS FOR
SERVICE CONNECTORS 106a, 106b 106c

| POWER SUPPLY | POWER SUPPLY |
|---|---|
| SHIELD | SHIELD |
| DATA − | DATA − |
| DATA + | DATA + |
| DAISY CHAIN IN − | DAISY CHAIN OUT − |
| DAISY CHAIN IN + | DAISY CHAIN OUT + |
| SHIELD | SHIELD |
| 1 COM. PORT 0 | 1 COM. PORT 1 |
| 2 I/O 1 PORT 0 | 2 I/O 1 PORT 1 |
| 3 I/O 2 PORT 0 | 3 I/O 2 PORT 1 |
| 4 I/O 3 PORT 0 | 4 I/O 2 PORT 1 |
| 5 I/O 4 PORT 0 | 5 I/O 4 PORT 1 |
| 6 I/O 5 PORT 0 | 6 I/O 5 PORT 1 |
| 7 I/O 6 PORT 0 | 7 I/O 6 PORT 1 |
| 8 I/O 7 PORT 0 | 8 I/O 7 PORT 1 |
| 9 I/O 8 PORT 0 | 9 I/O 8 PORT 1 |
| 10 I/O 9 PORT OR I/O 1 PORT 2 | 10 I/O 9 PORT 1 OR I/O 1 PORT 3 |
| 11 I/O 10 PORT 0 OR I/O PORT 2 | 11 I/O 10 PORT 1 OR I/O 2 PORT 3 |
| 12 I/O 11 PORT 0 OR I/O 3 PORT 2 | 12 I/O 11 PORT 1 OR I/O 2 PORT 3 |
| 13 I/O 12 PORT 0 OR I/O 4 PORT 2 | 13 I/O 12 PORT 1 OR I/O 4 PORT 3 |
| 14 I/O 13 PORT 0 OR I/O 5 PORT 2 | 14 I/O 13 PORT 1 OR I/O 5 PORT 3 |
| 15 I/O 14 PORT 0 OR I/O 6 PORT 2 | 15 I/O 14 PORT 1 OR I/O 6 PORT 3 |
| 16 I/O 15 PORT 0 OR I/O 7 PORT 2 | 16 I/O 15 PORT 1 OR I/O 7 PORT 3 |
| 17 I/O 16 PORT 0 OR I/O 8 PORT 2 | 17 I/O 16 PORT 1 OR I/O 8 PORT 3 |
| 18 COM. PORT 2 | 18 COM. PORT 3 |

TABLE II

TYPICAL INPUT/OUTPUT SIGNALS FOR MULTI-PIN CONNECTOR 113

| ROW 1 | ROW 2 | ROW 3 | DEFINITION |
| --- | --- | --- | --- |
| POWER SUPPLY | SHIELD | POWER SUPPLY | BUS |
| CTRL. LINE IN + | DATA + | CTRL. LINE OUT + | |
| CTRL. LIN IN − | DATA − | CTRL. LINE OUT − | |
| SPARE | SHIELD | SPARE | |
| I/O 1 PORT 0 | COM. PORT 0 | I/O 1 PORT 1 | INPUT |
| I/O 2 PORT 0 | COM. PORT 1 | I/O 1 PORT 1 | OUTPUT |
| I/O 4 PORT 0 | I/O 3 PORT 0 | I/O 4 PORT 1 | LINES |
| I/O 5 PORT 0 | I/O 3 PORT 1 | I/O 5 PORT 1 | |
| I/O 7 PORT 0 | I/O 6 PORT 0 | I/O 7 PORT 1 | |
| I/O 8 PORT 0 | I/O 6 PORT 1 | I/O 8 PORT 1 | |
| I/O 1/9 P 2/0 | I/O 3/11 P2/0 | I/O 1/9 P 3/1 | |
| I/O 2/10 P 2/0 | I/O 3/11 P 3/1 | I/O 2/10 P 3/11 | |
| I/O 4/12 P2/0 | I/O 6/14 P 3/11 | I/O 5/13 P 3/11 | |
| I/O 5/13 P 2/0 | I/O 6/14 P 3/11 | I/O 5/13 P 3/11 | |
| I/O 7/15 P 2/0 | COM. PORT 2 | I/O 7/15 P 3/11 | |
| I/O 8/16 P 2/0 | COM. PORT 4 | I/O 8/16 P 3/11 | |

Figure 4:
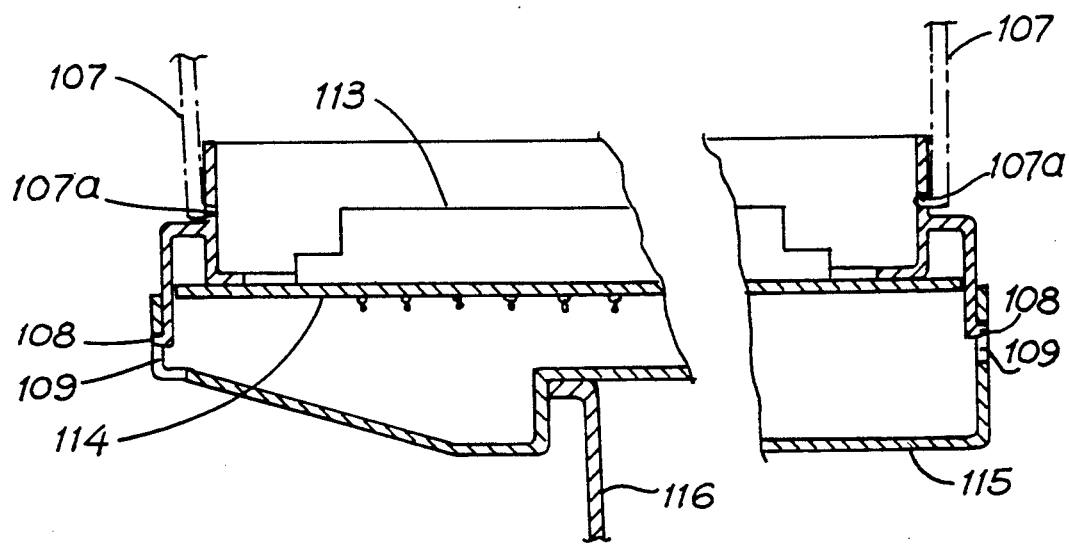
FIG. 4 is a cross-sectional view taken along the line 4—4 of FIG. 3 illustrating the details of the attachment of the backplane support member to the rail member, the printed wiring board/cartridge receptacle to the backplane support member.

FIG. 4 is a cross-sectional view taken along the line 4—4 of FIG. 3 illustrating the details of the attachment of the backplane support member 115 to the rail member 116, the printed wiring board-cartridge receptacle assembly 110 to the backplane support member 115 and multi-pin connector 113 mounted to printed wiring board 114 and shown protruding through aperture 111.

FIG. 5 shows in schematic diagram the present invention in a computer network application including a host computer 500 linking to bus rail arrangement in an enclosure of remote workstation 600 for configuring a plurality of modules 103 that are plugged into cartridge connector 105. Modules 103 are connected in a serial signal distribution manner to form a communication network to other modules 103 and to other workstations 600. The data signals are received on service connectors 106a, 106b and 106c on printed wiring board assembly 110 for distribution via circuit patterns on printed wiring board 114 and for daisy-chain/serial connection via other service connectors 106a, 106b and 106c to other backplane assemblies 110 and to other workstation members of the computer network.

Therefore, while the present invention has been shown and described herein in what is believed to be the most practical and preferred embodiments, it is recognized that departures can be made therefrom within the scope of the invention, which is therefore not to be limited to the details disclosed herein but is to be accorded the full scope of the claims so as to embrace any and all equivalent apparatus.

I claim:

1. An electronic computer network connector apparatus for interfacing control signals at a remote workstation, said apparatus comprising:
    cartridge member means for modularly housing a distributed control electronic card assembly, said cartridge means and said electronic card assembly forming a module, said module providing intelligence for operation of said workstation; and
    bus rail backplane assembly means for electronically interfacing with a host computer system, with said workstation, with other modules associated with said workstation and with other workstations in a local area network system, said backplane assembly means comprising:
    cartridge receptacle means for detachably retaining said cartridge member,
    plurality of service connectors for coupling common signals from said host computer to said module, to said workstation, to said other modules and to said other workstations.

2. An electronic computer network connector apparatus as recited in claim 1, wherein:
    said bus rail backplane assembly means comprises a backplane printed wiring board commonly interconnecting said module via a multi-pin connector disposed on said printed wiring board and said plurality of service connectors;
    said plurality of service connectors comprises power source connectors, shielded multi-lead cable connectors, and multi-pin, single row, quick-disconnect connectors; and
    said printed wiring board having circuit patterns that common electrical signals between said plurality of service connectors and said multi-pin connector that plug to said module.

3. An electronic computer network connector apparatus as recited in claim 1, wherein said cartridge member means comprises:
    a pair of laterally disposed latching means for compressively engaging first mating apertures laterally disposed on said cartridge receptacle means.

4. An electronic computer network connector apparatus as recited in claim 3, wherein said cartridge receptacle means comprises:
    a plurality of laterally disposed latching means for compressively engaging second mating apertures laterally disposed on a backplane support member of said bus rail backplane assembly means.

5. An electronic computer network connector apparatus as recited in claim 4, wherein said cartridge receptacle means further comprises:
    an aperture means for enabling plugging of a multi-pin connector member of said module with a mating connector disposed on a backplane printed wiring member.

6. An electronic computer network connector apparatus as recited in claim 1, wherein said cartridge receptacle means comprises:
    a plurality of laterally disposed latching means for compressively engaging mating apertures laterally disposed on a backplane support member of said bus rail backplane assembly means.

7. An electronic computer network connector apparatus as recited in claim 6, wherein said cartridge receptacle means further comprises:
    an aperture means for enabling plugging of a multi-pin connector member of said module with a mating connector disposed on a backplane printed wiring member; and shroud means for guiding said cartridge member means into said cartridge receptacle means.

8. An electronic computer network connector apparatus for interfacing control signals at a remote workstation, said apparatus comprising:

cartridge member means for modularly housing a distributed control electronic card assembly, said cartridge means and said electronic card assembly forming a module, said module providing intelligence for operation of said workstation;

bus rail backplane assembly means for electronically interfacing with a host computer system, with said workstation, with other backplane assembly means associated with other workstations in a local area network system, said backplane assembly means being associated with a particular module and having:

backplane printed wiring board, multi-pin connector for coupling to a mating connector on said module, cartridge receptacle means for detachably retaining said cartridge member, plurality of service connectors for coupling common control data signals to said module and for daisy-chain serial interfacing said common control data signals to said other backplane assembly means connected to said other workstations, backplane support member, and rail attachment member for supporting said connector apparatus in a workstation enclosure.

9. An electronic computer network connector apparatus as recited in claim 8, wherein:

said bus rail backplane assembly means comprises a backplane printed wiring board commonly interconnecting said module via a multi-pin connector disposed on said printed wiring board and said plurality of service connectors;

said plurality of service connectors comprises power source connectors, shielded multi-lead cable connectors, and multi-pin, single row, quick-disconnect connectors; and said printed wiring board having circuit patterns that common electrical signals between said plurality of service connectors and said multi-pin connector that plug to said module.

10. An electronic computer network connector apparatus as recited in claim 8, wherein said cartridge member means comprises:

a pair of laterally disposed latching means for compressively engaging first mating apertures laterally disposed on said cartridge receptacle means.

11. An electronic computer network connector apparatus as recited in claim 10, wherein said cartridge receptacle means comprises:

a plurality of laterally disposed latching means for compressively engaging second mating apertures laterally disposed on a backplane support member of said bus rail backplane assembly means.

12. An electronic computer network connector apparatus as recited in claim 11, wherein said cartridge receptacle means further comprises:

an aperture means for enabling plugging of a multi-pin connector member of said module with a mating connector disposed on a backplane printed wiring member.

13. A method for serially interfacing distributed control modules in a local area computer network, said method comprising the steps of:

(a) providing an electronic computer network connector apparatus for interfacing control signals at a remote workstation, said apparatus comprising:

cartridge member means for modularly housing a distributed control electronic card assembly, said cartridge means and said electronic card assembly forming a module, said module providing intelligence for operation of said workstation, bus rail backplane assembly means for electronically interfacing with a host computer system, with said workstation, with other backplane assembly means associated with other workstations in a local area network system, said backplane assembly means being associated with a particular module and having: 'backplane printed wiring board, multi-pin connector for coupling to a mating connector on said module, cartridge receptacle means for detachably retaining said cartridge member, plurality of service connectors for coupling common control data signals to said module and for daisy-chain serial interfacing said common control data signals to said other backplane assembly means connected to said other workstations, backplane support member, and rail attachment member for supporting said connector apparatus in a workstation enclosure, said bus rail backplane assembly means comprises a backplane printed wiring board commonly interconnecting said module via a multi-pin connector disposed on said printed wiring board and said plurality of service connectors, said printed wiring board having circuit patterns that common electrical signals between said plurality of service connectors and said multi-pin connector that plug to said module;

(b) installing said computer network connector apparatus in an enclosure portion of a workstation member of said computer network;

(c) interfacing signals from a host computer to a one of said service connectors for common interconnecting to said multi-pin connector that plugs to said module and to another one of said service connectors for serial signal distribution; and (d) servicing said computer network via said service connectors without interrupting data communication to said module.

* * * * *